United States Patent
Morikazu

(10) Patent No.: US 7,618,892 B2
(45) Date of Patent: Nov. 17, 2009

(54) VIA HOLE FORMING METHOD

(75) Inventor: Hiroshi Morikazu, Tokyo (JP)

(73) Assignee: Disco Corporation, Tokyo (JP)

( * ) Notice: Subject to any disclaimer, the term of this patent is extended or adjusted under 35 U.S.C. 154(b) by 338 days.

(21) Appl. No.: 11/808,719

(22) Filed: Jun. 12, 2007

(65) Prior Publication Data
US 2008/0045036 A1 Feb. 21, 2008

(30) Foreign Application Priority Data
Jun. 29, 2006 (JP) .............................. 2006-180088

(51) Int. Cl.
*H01L 21/44* (2006.01)
(52) U.S. Cl. .............................. 438/667; 257/E21.578; 438/672; 438/673; 438/674; 438/675; 438/676
(58) Field of Classification Search ................. 438/667, 438/672–676; 257/E21.578
See application file for complete search history.

(56) References Cited

U.S. PATENT DOCUMENTS

| | | | |
|---|---|---|---|
| 4,964,212 A * | 10/1990 | Deroux-Dauphin et al. ... | 29/852 |
| 7,057,274 B2 * | 6/2006 | Heschel ....................... | 257/698 |
| 7,449,784 B2 * | 11/2008 | Sherrer et al. ................ | 257/774 |
| 2004/0198040 A1 * | 10/2004 | Geefay et al. ................ | 438/667 |
| 2007/0026639 A1 * | 2/2007 | Noma et al. ................. | 438/459 |
| 2007/0045254 A1 | 3/2007 | Morikazu | |
| 2007/0257373 A1 * | 11/2007 | Akram et al. ................ | 257/774 |

FOREIGN PATENT DOCUMENTS

| JP | 2003-163323 | 6/2003 |
|---|---|---|
| JP | 2007-67082 | 3/2007 |

* cited by examiner

*Primary Examiner*—Asok K Sarkar
(74) *Attorney, Agent, or Firm*—Smith, Gambrell & Russell, LLP

(57) ABSTRACT

A method of forming a via hole reaching a bonding pad in a wafer having an insulating film constituting a plurality of devices on the front surface of a substrate and bonding pads on each of the devices by applying a pulse laser beam to the rear surface of the substrate, the method comprising the steps of:

forming a non-through hole reaching the insulating film formed on the substrate by applying a pulse laser beam to the rear surface of the substrate;

forming an insulating film on the inner wall of the hole which is formed in the substrate by the first step; and forming a via hole reaching a bonding pad by applying a pulse laser beam to the hole having the insulating film which is formed on the inner wall by the insulating film forming step.

3 Claims, 4 Drawing Sheets

VIA HOLE FORMING METHOD

FIELD OF THE INVENTION

The present invention relates to a method of forming a via hole reaching a bonding pad in a wafer having a plurality of devices on the front surface of a substrate and bonding pads on each of the devices by applying a pulse laser beam to the rear surface of the substrate.

DESCRIPTION OF THE PRIOR ART

In the production process of a semiconductor device, a plurality of areas are defined by dividing lines called "streets" arranged in a lattice on the front surface of a substantially disk-like semiconductor wafer, and a device such as IC or LSI is formed in each of the defined areas. Individual semiconductor chips are manufactured by cutting this semiconductor wafer along the streets to divide it into the device formed areas.

To reduce the size and increase the number of functions of an apparatus, a modular structure for connecting the bonding pads of a plurality of semiconductor chips which are formed in a layer has been implemented. As disclosed by JP-A 2003-163323, for example, this modular structure is such that a plurality of devices are formed on the front surface of a substrate constituting a semiconductor wafer, bonding pads are formed on each of the devices, via holes reaching the bonding pads are formed from the rear side of the substrate at positions where the bonding pads are formed, and a conductive material such as aluminum or copper for connecting the bonding pads is buried in the via holes.

The via holes formed in the above semiconductor wafer are generally formed by a drill. Therefore, the diameters of the via holes formed in the semiconductor wafer are as small as 100 to 300 μm, and drilling the via holes is not always satisfactory in terms of productivity. In addition, as the thickness of each of the above bonding pads is about 1 to 5 μm, in order to form the via holes only in the substrate such as a substrate made of silicon and the like forming the wafer without damaging the bonding pads, the drill must be controlled extremely accurately.

To solve the above problem, the applicant of the present application proposes as Japanese Patent Application No. 2005-249643 (JP-A 2007-67082) a method of efficiently forming a via hole reaching a bonding pad in a wafer having a plurality of devices on the front surface of a substrate and bonding pads on each of the devices by applying a pulse laser beam to the rear surface of the substrate.

Although a conductive material such as aluminum or copper is buried in the via holes formed in the substrate as described above, when aluminum or copper is directly buried in the via holes, aluminum or copper atoms diffuse into the inside of the substrate made of silicon to decrease the quality of each device. Therefore, after an insulating film is formed on the inner walls of the via holes, a conductive material such as aluminum or copper is buried.

Therefore, when the via holes are formed by applying a pulse laser beam as described above, the laser beam used to form the via holes in the substrate made of silicon is slightly applied to the rear surfaces of the bonding pads, whereby metal atoms forming the bonding pads are scattered to become metal contaminants which adhere to the inner walls of the via holes. When aluminum or copper atoms adhere to the inner walls of the via holes, the atoms diffuse into the inside of the substrate made of silicon and the like to reduce the quality of each device.

SUMMARY OF THE INVENTION

It is an object of the present invention to provide a via hole forming method which is capable of preventing the diffusion of metal atoms into the inside of a substrate even when metal contaminants are produced.

To attain the above object, according to the present invention, there is provided a method of forming a via hole reaching a bonding pad in a wafer having an insulating film constituting a plurality of devices on the front surface of a substrate and bonding pads on each of the devices by applying a pulse laser beam to the rear surface of the substrate, the method comprising the steps of:

Forming a non through hole reaching the insulating film formed on the substrate by applying a pulse laser beam to the rear surface of the substrate;

forming an insulating film on the inner wall of the hole which is formed in the substrate by the first step; and forming a via hole reaching a bonding pad by applying a pulse laser beam to the hole having the insulating film which is formed on the inner wall by the insulating film forming step.

The above insulating film forming a device layer is made of silicon dioxide ($SiO_2$), and the above insulating film forming step is to deposit silicon dioxide ($SiO_2$) on the inner wall of the hole by chemical vapor deposition (CVD).

The pulse laser beam applied in the above first step has an energy density per pulse of 20 to 35 $J/cm^2$ and the pulse laser beam applied in the above via hole forming step has an energy density per pulse of 35 to 45 $J/cm^2$.

In the via hole forming method of the present invention, after the hole reaching the device layer is formed in the substrate by the first step, the insulating film forming step is carried out to form an insulating film on the inner wall of the hole. Therefore, if the metal atoms of the bonding pad are scattered when a via hole reaching a bonding pad is formed by the via hole forming step, the scattered metal atoms are shut off by the insulating film. Consequently, the metal atoms do not diffuse into the inside of the substrate to reduce the quality of each device.

DETAILED DESCRIPTION OF THE PREFERRED EMBODIMENT

A preferred embodiment of the present invention will be described in detail hereinbelow with reference to the accompanying drawings.

Figure 1:
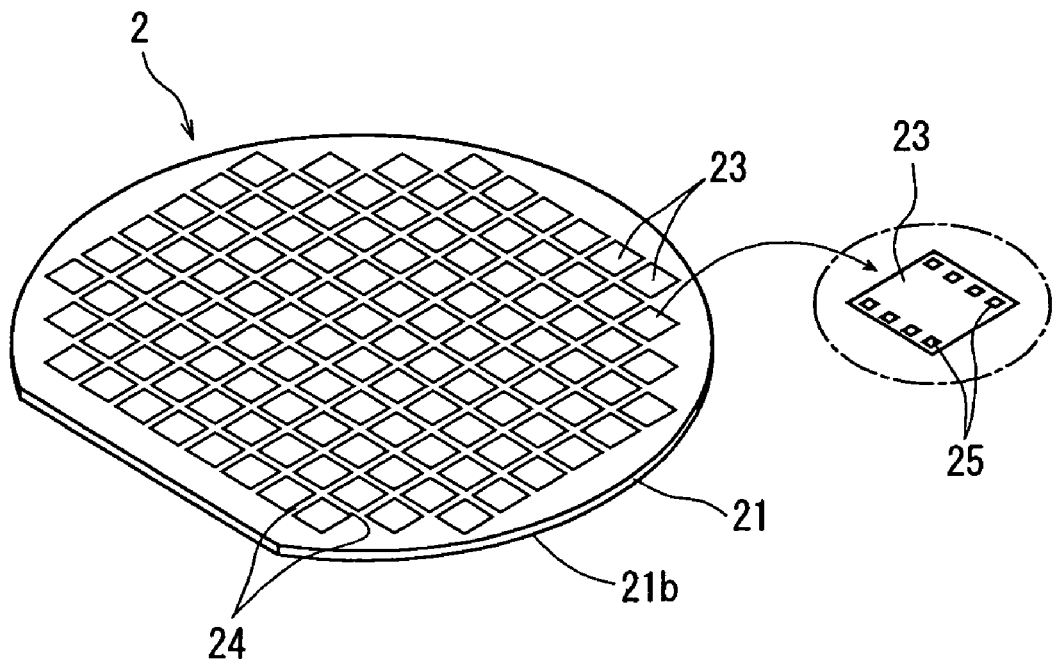
FIG. 1 is a perspective view of a semiconductor wafer as a wafer to be processed by the via hole forming method of the present invention.
Figure 2:
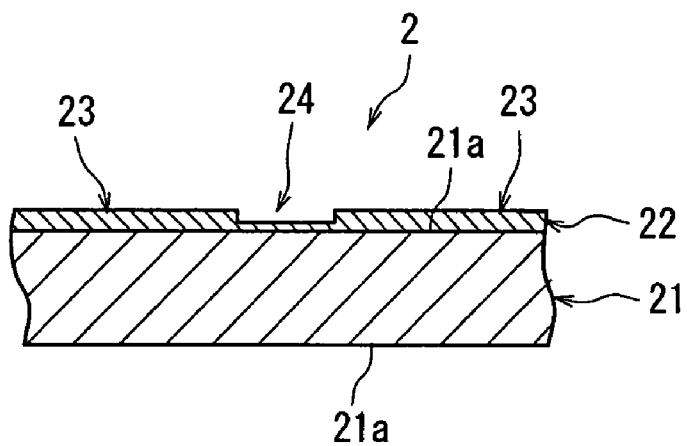
FIG. 2 is an enlarged sectional view of the key section of the semiconductor wafer shown in FIG. 1.

FIG. 1 is a perspective view of a semiconductor wafer 2 as the wafer to be processed by the via hole forming method of the present invention and FIG. 2 is an enlarged sectional view of the key section of the semiconductor wafer 2 shown in FIG. 1. In the semiconductor wafer 2 shown in FIG. 1 and FIG. 2, a plurality of devices 23 such as IC's and LSI's are composed of a device layer 22 having a thickness of about 8 µm and consisting of an insulating film made of silicon dioxide ($SiO_2$) and a functional film and formed in a matrix on the front surface 21a of a substrate 21 having a thickness of, for example, 100 µm and made of silicon. The devices 23 are defined by streets 24 formed in a lattice. The devices 23 are the same in structure. A plurality of bonding pads 25 are formed on the surface of each device 23. The bonding pads 25 are made of a metal material such as aluminum, copper, gold, platinum or nickel and have a thickness of, for example, 2 µm.

Figure 3:
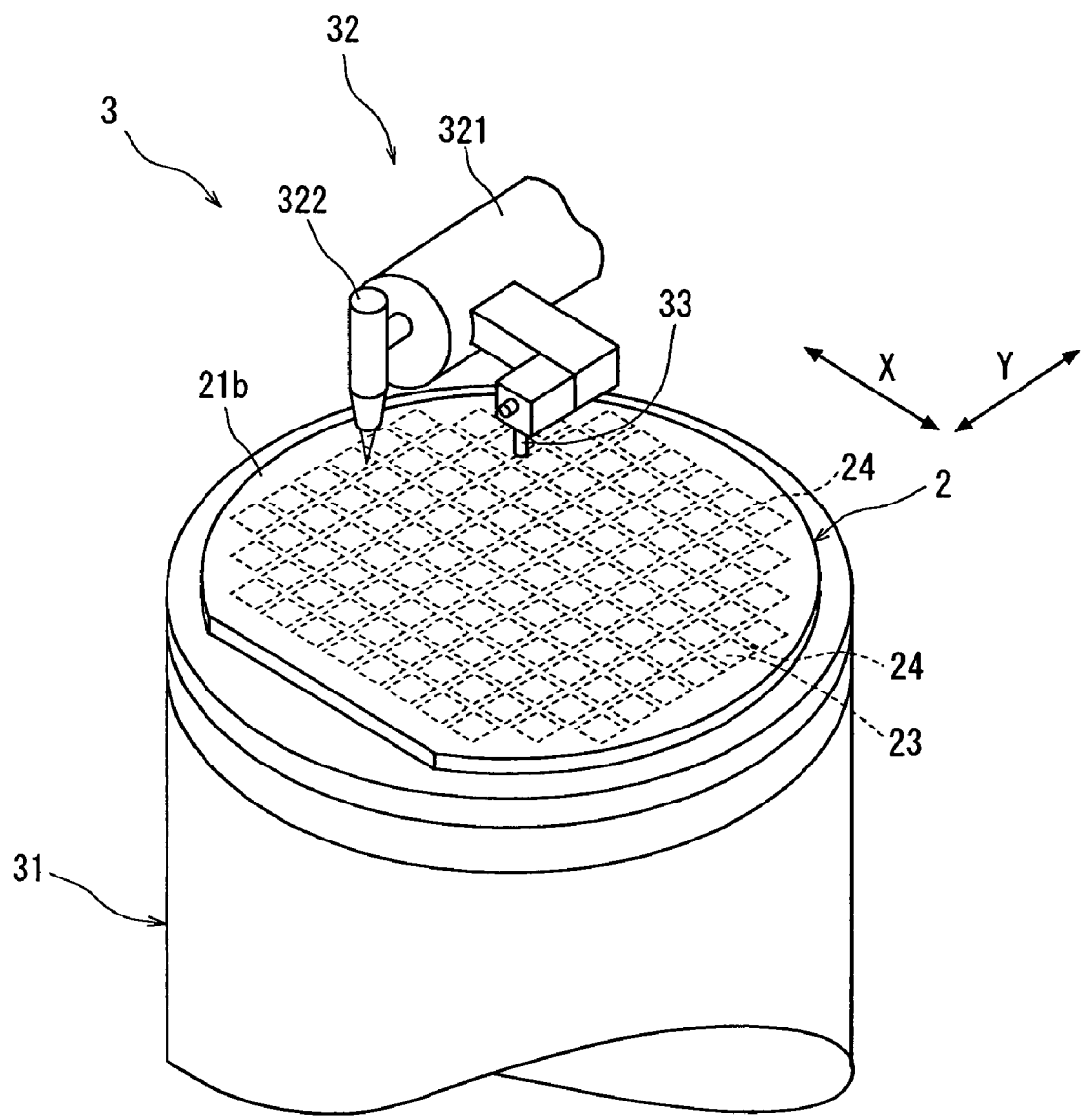
FIG. 3 is a perspective view of a laser beam machine for carrying out the via hole forming method of the present invention.

Via holes reaching the bonding pads 25 are formed in the above semiconductor wafer 2 by applying a pulse laser beam to the rear surface 21b of the substrate 21. To form the via holes in the substrate 21 and device layer 22 of the semiconductor wafer 2, a laser beam machine 3 shown in FIG. 3 is used. The laser beam machine 3 shown in FIG. 3 comprises a chuck table 31 for holding a workpiece and laser beam application means 32 for applying a laser beam to the workpiece held on the chuck table 31. The chuck table 31 is designed to suction hold the workpiece and to be moved in a feed direction shown by an arrow X in FIG. 3 by an unshown feed mechanism and an indexing direction shown by an arrow Y by an unshown indexing mechanism.

The above laser beam application means 32 applies a pulse laser beam from a condenser 322 mounted to the end of a cylindrical casing 321 arranged substantially horizontally. The illustrated laser beam machine 3 comprises image pick-up means 33 mounted to the end portion of the casing 321 constituting the above laser beam application means 32. This image pick-up means 33 comprises infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation. An image signal is supplied to unshown control means.

A description is subsequently given of the method of forming via holes in the above semiconductor wafer 2 by using the above-described laser beam machine 3.

The front side of the semiconductor wafer 2 is first placed on the chuck table 31 of the laser beam machine 3 shown in FIG. 3, and the semiconductor wafer 2 is suction held on the chuck table 31. Therefore, the semiconductor wafer 2 is held in such a manner that the rear surface 21b of the substrate 21 faces up.

The chuck table 31 suction holding the semiconductor wafer 2 as described above is positioned right below the image pick-up means 33 by the unshown feed mechanism. After the chuck table 31 is positioned right below the image pick-up means 33, the semiconductor wafer 2 on the chuck table 31 is supposed to be located at a predetermined coordinate position. In this state, alignment work for checking whether the streets 24 formed in a lattice on the semiconductor wafer 2 held on the chuck table 31 are parallel to the X direction and the Y direction is carried out. That is, the image pick-up means 33 picks up an image of the semiconductor wafer 2 held on the chuck table 31 and carries out image processing such as pattern matching to perform the alignment work. Although the street 24 formed front surface 21a of the substrate 21 of the semiconductor wafer 2 faces down at this point, an image of the streets 24 can be picked up through the rear surface 21b of the substrate 21 as the image pick-up means 33 comprises infrared illuminating means, an optical system for capturing infrared radiation and an image pick-up device (infrared CCD) for outputting an electric signal corresponding to the infrared radiation as described above.

By carrying out the above-described alignment work, the semiconductor wafer 2 held on the chuck table 31 is located at the predetermined coordinate position. The designed coordinate positions of the plurality of bonding pads 25 formed on the devices 23 composed of the device layer 22 on the front surface 21a of the substrate 21 of the semiconductor wafer 2 are stored in the unshown control means of the laser beam machine 3 in advance.

Figure 4:
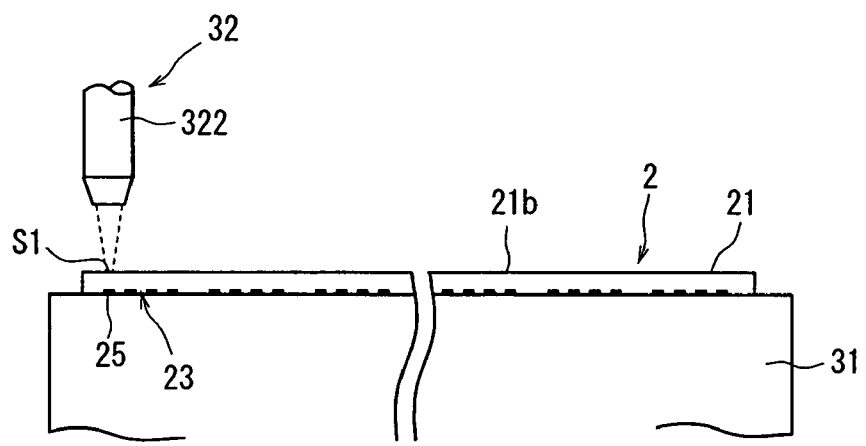
FIG. 4 is a diagram showing the first step in the via hole forming method of the present invention.

After the above alignment work is carried out, the chuck table 31 is moved as shown in FIG. 4 to position a device 23 at the most left end in FIG. 4 out of the plurality of devices 23 formed in a predetermined direction on the substrate 21 of the semiconductor wafer 2 right below the condenser 322. Then, a bonding pad 25 at the most left end out of the plurality of bonding pads 25 formed on the device 23 at the most left end in FIG. 4 is positioned right below the condenser 322.

Next comes the first step for forming non through holes reaching the device layer 22 in the substrate 21 by applying a pulse laser beam to the rear surface 21b of the substrate 21. In this first step, the energy density of the pulse laser beam applied from the condenser 322 of the laser beam application means 32 is set to a level (25 to 35 J/cm$^2$ per pulse) which can process a semiconductor substrate made of silicon efficiently but hardly processes a silicon dioxide ($SiO_2$) film. A predetermined number of pulses of the pulse laser beam are applied to the rear surface 21b of the substrate 21 from the condenser 322 of the laser beam application means 32.

The processing conditions in this first step are set as follows.

Figure 5:
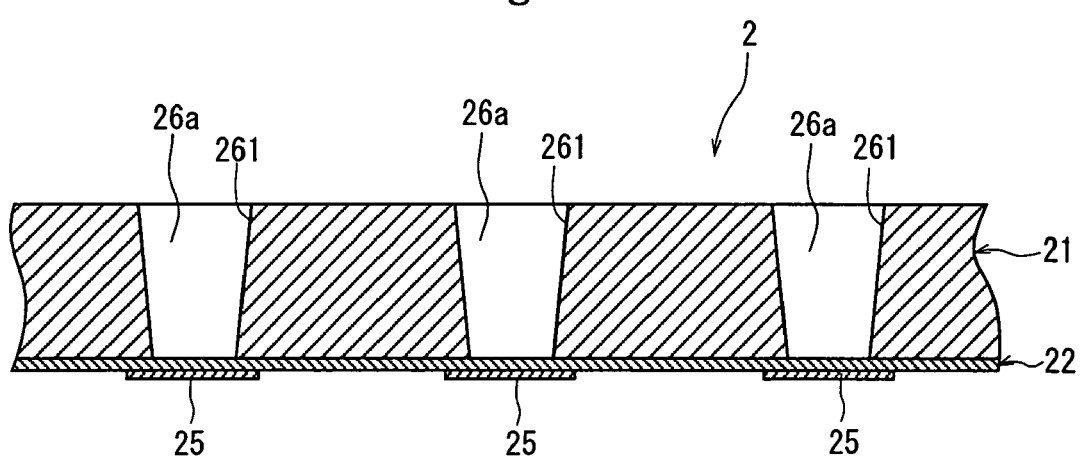
FIG. 5 is a partially enlarged sectional view of the semiconductor wafer having non through holes which are formed by the first step in the via hole forming method of the present invention.

Light source of laser beam: YVO4 laser or YAG laser
Wavelength: 355 nm
Energy density per pulse: 30 J/cm$^2$
Spot diameter: φ 30 µm Under the above processing conditions, when the substrate 21 of the semiconductor wafer 2 is made of silicon, as shown in FIG. 4, a hole having a depth of 5 µm can be formed with one pulse of the pulse laser beam by setting a spot S1 having the above spot diameter to the rear surface 21b (top surface) of the substrate 21. Therefore, by applying 20 pulses of the pulse laser beam, a non-through hole 26a reaching the insulating film of the device layer 22 is formed in the substrate 21 having a thickness of 100 µm as shown in FIG. 5. The inner wall 261 of the hole 26a formed as described above is tapered from the rear surface 21b of the substrate 21 toward the device layer 22. When the spot diameter of the pulse laser beam is 30 µm, the diameter of the hole 26a on the rear surface 21b side of the substrate 21 is about 40 µm. Therefore, the spot diameter of the pulse laser beam is preferably 0.75 to 0.9D when the diameter of the via hole to be formed is represented by D.

In the above first step, the substrate 21 is processed right before the device layer 22 by applying a pulse laser beam having a relatively high energy density per pulse of 35 to 60 J/cm$^2$ to the substrate 21 of the semiconductor wafer 2 and then the device layer 22 is processed by adjusting the energy density per pulse of the pulse laser beam to 20 to 35 J/cm$^2$, thereby making it possible to form the hole 26a reaching the insulating film of the device layer 22 efficiently.

Figure 6:
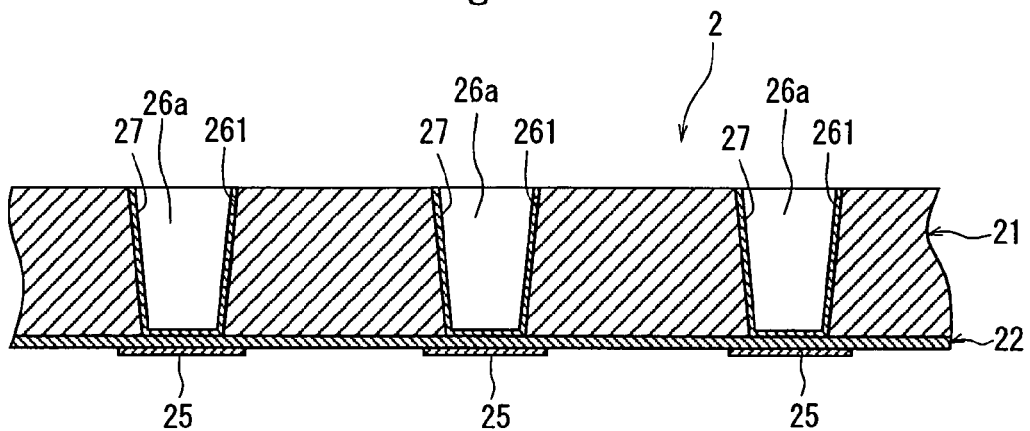
FIG. 6 is a partially enlarged sectional view of the semiconductor wafer which has been subjected to the insulating film forming step in the via hole forming method of the present invention.

After the above first step is carried out at positions corresponding to all the bonding pads 25 formed on the semiconductor wafer 2, next comes the step of forming an insulating film on the inner walls 261 of the holes 26a formed in the substrate 21 by the first step. That is, the semiconductor wafer 2 which has been subjected to the first step is taken out from the chuck table 31 of the laser beam machine 3 and carried to an insulating film forming apparatus so as to carry out the insulating film forming step. In this insulating film forming step, silicon dioxide (SiO$_2$) is preferably deposited by chemical vapor deposition (CVD). As a result, an insulating film 27 made of silicon dioxide (SiO$_2$) is formed on the inner walls 261 of the holes 26a formed in the substrate 21 as shown in FIG. 6. The insulating film 27 has a thickness of about 1 μm.

Figure 7:
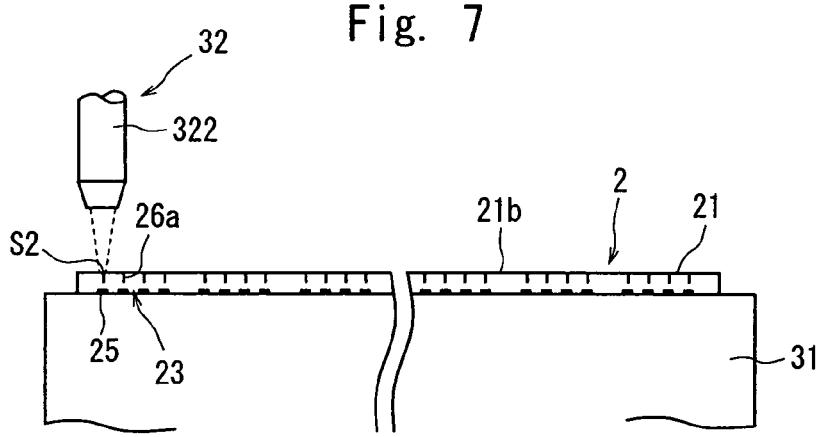
FIG. 7 is a diagram showing the via hole forming step in the via hole forming method of the present invention.

Next comes the step of forming a via hole reaching a bonding pad 25 by applying a pulse laser beam to the hole 26a having the insulating film 27 which is formed on the inner wall 261 by the insulating film forming step. This via hole forming step is carried out by using the above laser beam machine 3. That is, the semiconductor wafer 2 which has been subjected to the above insulating film forming step is carried to the chuck table 31 of the laser beam machine 3, and the front surface 2a of the semiconductor wafer 2 is placed on the chuck table 31 and suction held on the chuck table 31 in such a manner that the rear surface 21b of the semiconductor wafer 2 faces up. After the above alignment work is carried out, the chuck table 31 is moved as shown in FIG. 7 to position a device 23 at the most left end in FIG. 7 out of the plurality of devices 23 formed in the predetermined direction on the substrate 21 of the semiconductor wafer 2 right below the condenser 322. Then, a hole 26a at the most left end out of the holes 26a formed at positions corresponding to the plurality of bonding pads 25 formed on the device 23 at the most left end in FIG. 7 is positioned right below the condenser 322. The energy density of a pulse laser beam applied from the condenser 322 of the laser beam application means 32 is set to a level (35 to 45 J/cm$^2$ per pulse) which can process the silicon dioxide (SiO$_2$) film efficiently but hardly processes the bonding pad 25 made of metal, and a predetermined number of pulses are applied to the rear surface 21b of the substrate 21.

The processing conditions in this via hole forming step are set as follows.

Figure 8:
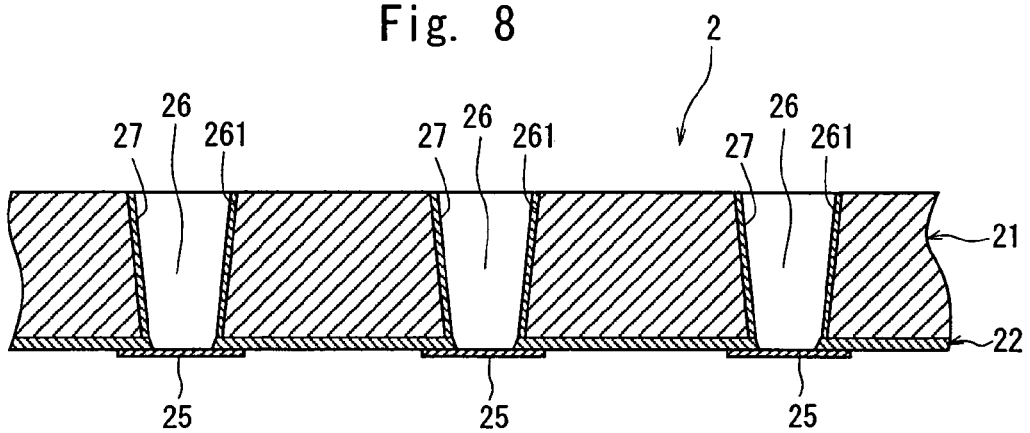
FIG. 8 is a partially enlarged sectional view of the semiconductor wafer having via holes which are formed by the via hole forming step in the via hole forming method of the present invention.

Light source of laser beam: YVO4 laser or YAG laser
Wavelength: 355 nm
Energy density per pulse: 40 J/cm$^2$
Spot diameter: φ 15 μm Under the above processing conditions, when the insulating film forming the device layer 22 of the semiconductor wafer 2 is made of silicon dioxide (SiO$_2$), as shown in FIG. 7, a hole having a depth of about 4 μm can be formed with one pulse of the pulse laser beam by setting a spot S2 having the above spot diameter to the rear surface 21b (top surface) of the substrate 21. Therefore, by applying 2 pulses of the pulse laser beam, a via hole 26 reaching the bonding pad 25 is formed in the device layer 22 comprising the insulating film and having a thickness of 8 μm as shown in FIG. 8. This via hole forming step is carried out on all the holes 26a formed in the substrate 21 of the semiconductor wafer 2.

When the above via hole forming step is carried out, the pulse laser beam used to form the via holes is slightly applied to the rear surfaces of the bonding pads 25. Although the energy density of the pulse laser beam applied in the via hole forming step is set to a level (35 to 45 J/cm$^2$ per pulse) which can process a semiconductor substrate made of silicon but hardly processes a metal, metal atoms of the metal forming the bonding pads 25 are slightly scattered. Since the insulating film 27 made of silicon dioxide (SiO$_2$) is formed on the inner walls 261 of the via holes 26 formed in the substrate 21 by the above insulating film forming step, the scattered metal atoms are shut off by the insulating film 27. Consequently, the metal atoms do not diffuse into the inside of the substrate 21 to reduce the quality of each device 23.

What is claimed is:

1. A method of forming a via hole reaching a bonding pad in a wafer having an insulating film constituting a plurality of devices on the front surface of a substrate and bonding pads on each of the devices by applying a pulse laser beam to the rear surface of the substrate, the method comprising the steps of:

forming a non-through hole reaching the insulating film formed on the substrate by applying a pulse laser beam to the rear surface of the substrate;

forming an insulating film on the inner wall of the hole which is formed in the substrate by the first step; and forming a via hole reaching a bonding pad by applying a pulse laser beam to the hole having the insulating film which is formed on the inner wall by the insulating film forming step.

2. The via hole forming method according to claim 1, wherein the insulating film forming a device layer is made of silicon dioxide (SiO$_2$), and the insulating film forming step is to deposit silicon dioxide (SiO$_2$) on the inner wall of the hole by chemical vapor deposition (CVD).

3. The via hole forming method according to claim 1 or 2, wherein the pulse laser beam applied in the first step has an energy density per pulse of 20 to 35 J/cm$^2$ and the pulse laser beam applied in the via hole forming step has an energy density per pulse of 35 to 45 J/cm$^2$.

* * * * *